(12) United States Patent
Denison et al.

(10) Patent No.: US 7,786,507 B2
(45) Date of Patent: Aug. 31, 2010

(54) SYMMETRICAL BI-DIRECTIONAL SEMICONDUCTOR ESD PROTECTION DEVICE

(75) Inventors: Marie Denison, Plano, TX (US); Pinghai Hao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/349,178

(22) Filed: Jan. 6, 2009

(65) Prior Publication Data
US 2010/0171149 A1 Jul. 8, 2010

(51) Int. Cl.
*H01L 29/74* (2006.01)
(52) U.S. Cl. .................. 257/173; 257/355
(58) Field of Classification Search ........... 257/173, 257/328, 355, 361, 488
See application file for complete search history.

(56) References Cited
U.S. PATENT DOCUMENTS
7,034,364 B2 4/2006 Steinhoff

2009/0166721 A1* 7/2009 Denison et al. ............ 257/328

* cited by examiner

*Primary Examiner*—Mark Prenty
(74) *Attorney, Agent, or Firm*—Warren L. Franz; Wade J. Brady, III; Frederick J. Telecky, Jr.

(57) ABSTRACT

A 2-terminal (i.e., anode, cathode) symmetrical bi-directional semiconductor electrostatic discharge (ESD) protection device is disclosed. The symmetrical bi-directional semiconductor ESD protection device design comprises a first and second shallow wells symmetrically spaced apart from a central floating well. Respective shallow wells comprise a first and second highly doped contact implant with opposite doping types (e.g., n-type, p-type). One or more field plates, connected to the central floating well, extend laterally outward from above the central well. The device can be used as an ESD protection device at a bi-directional I/O (e.g., in parallel with a symmetrical MOS to be protected). Upon an ESD event at an input node comprising the first and second shallow wells, a coupled npn-pnp bipolar component comprising the center well, the first and second shallow wells, and the first and second contact implants, is triggered, thereby shunting current from the first to the second shallow well.

25 Claims, 14 Drawing Sheets

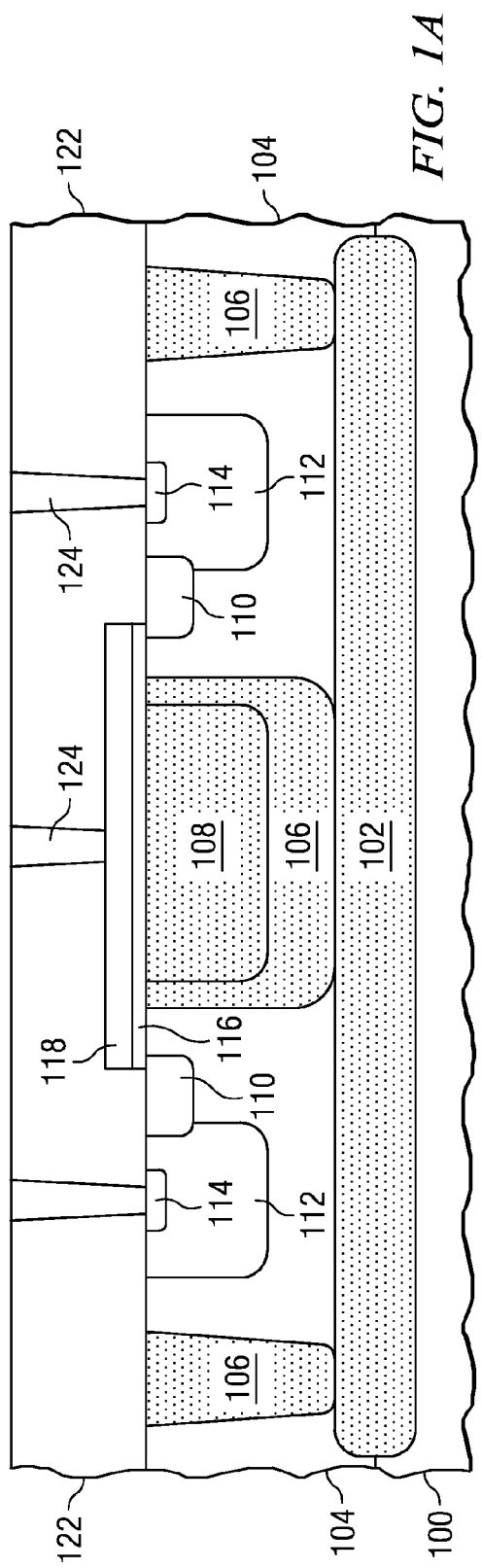
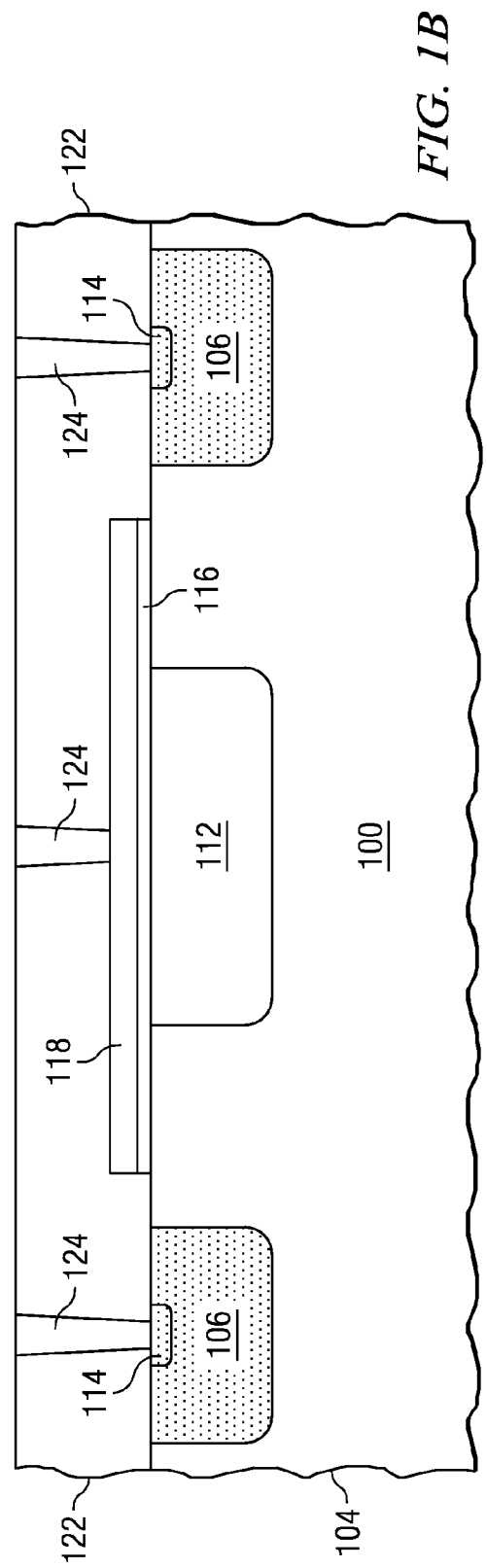
FIG. 1A
FIG. 1B

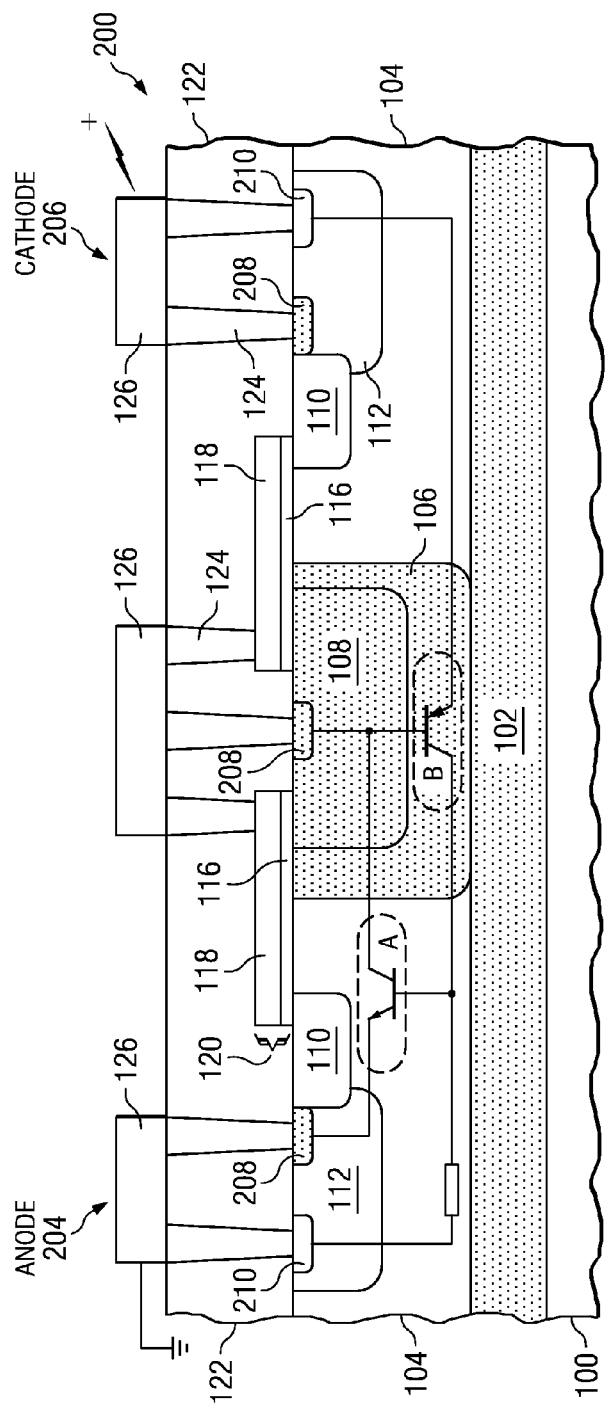
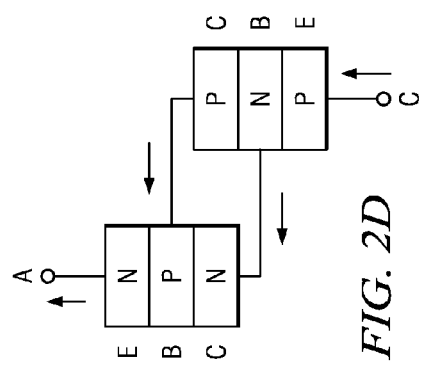
FIG. 2C
FIG. 2D

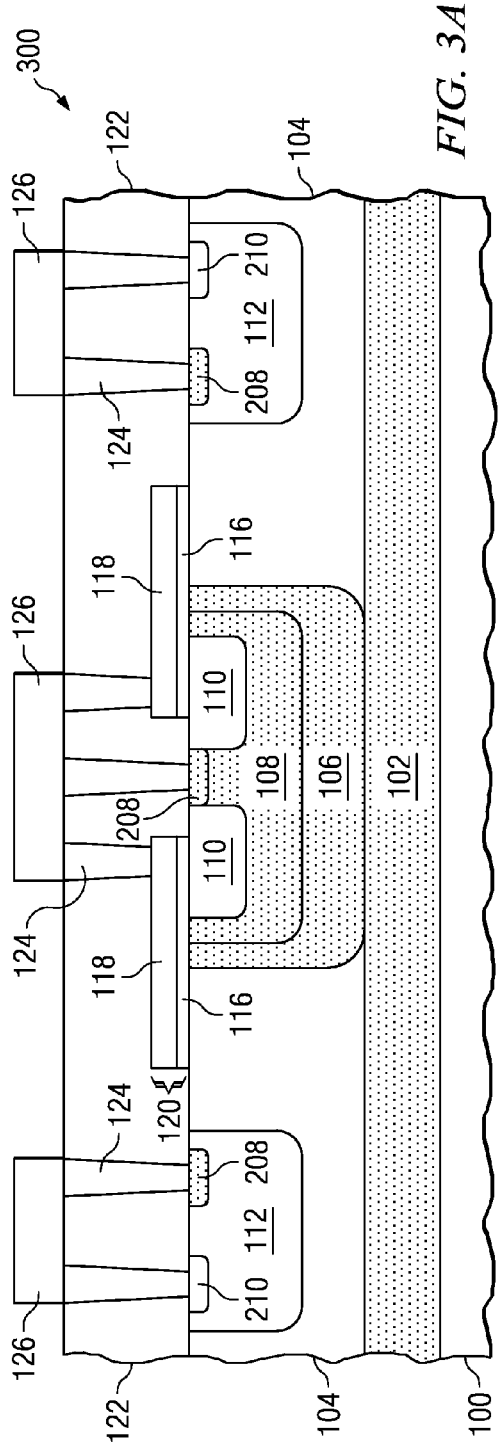
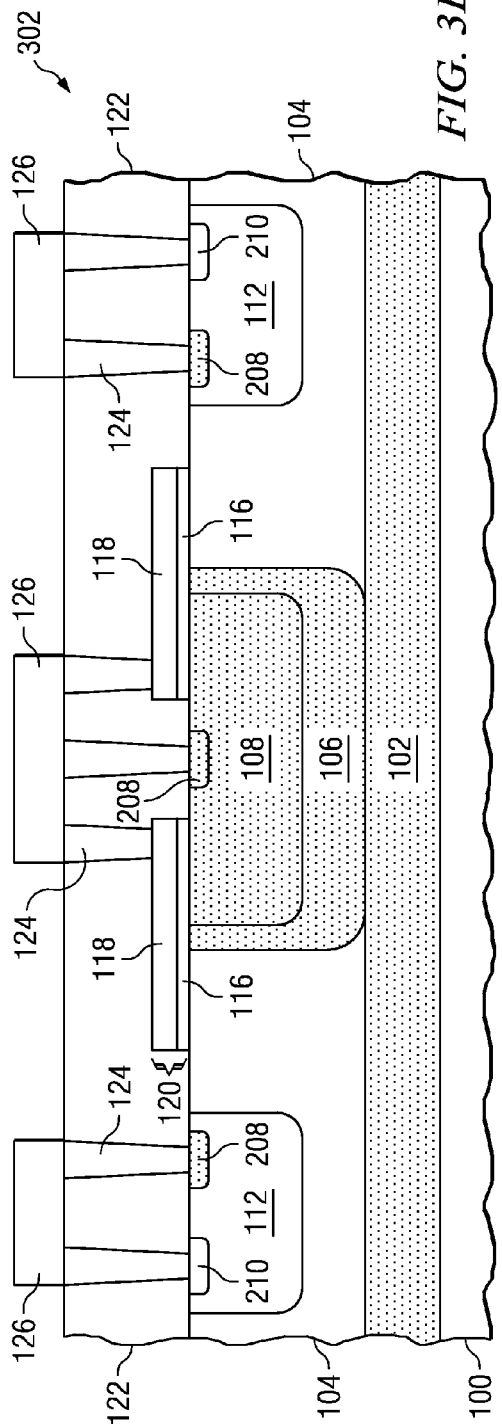
FIG. 3A
FIG. 3B

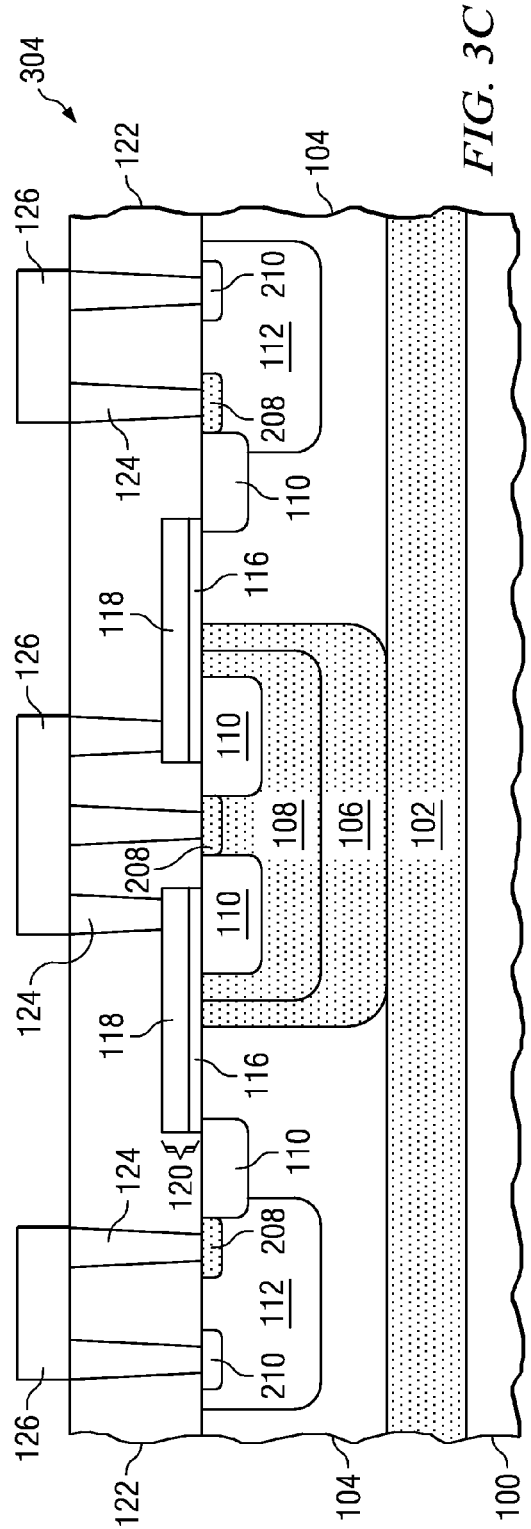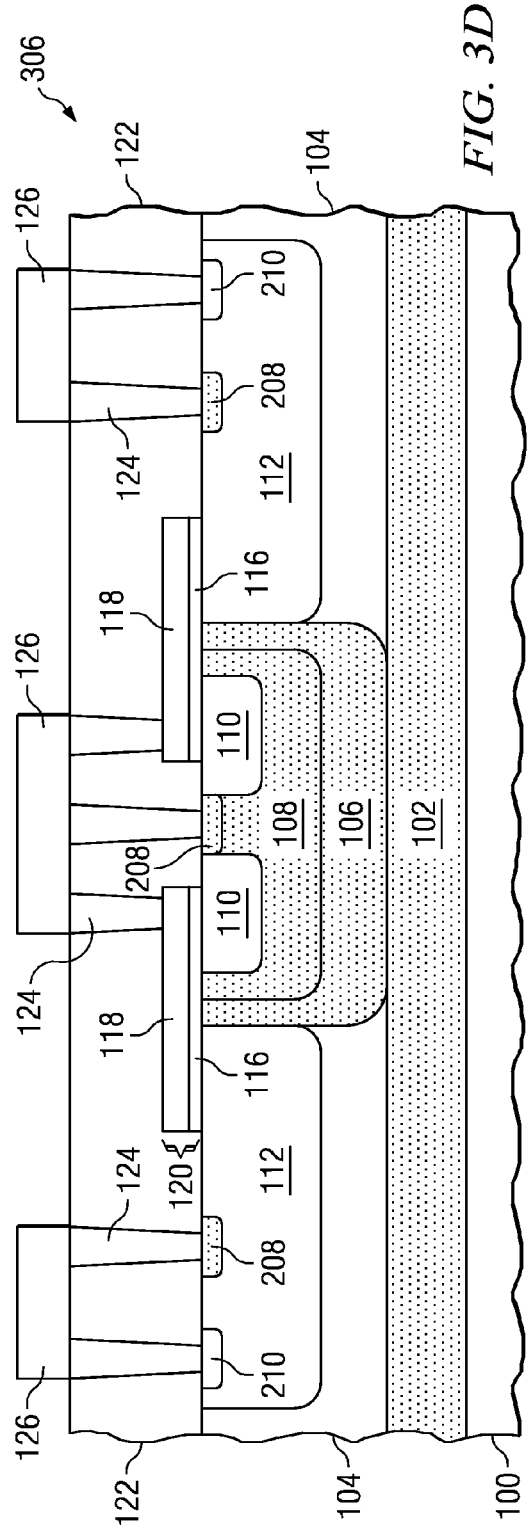

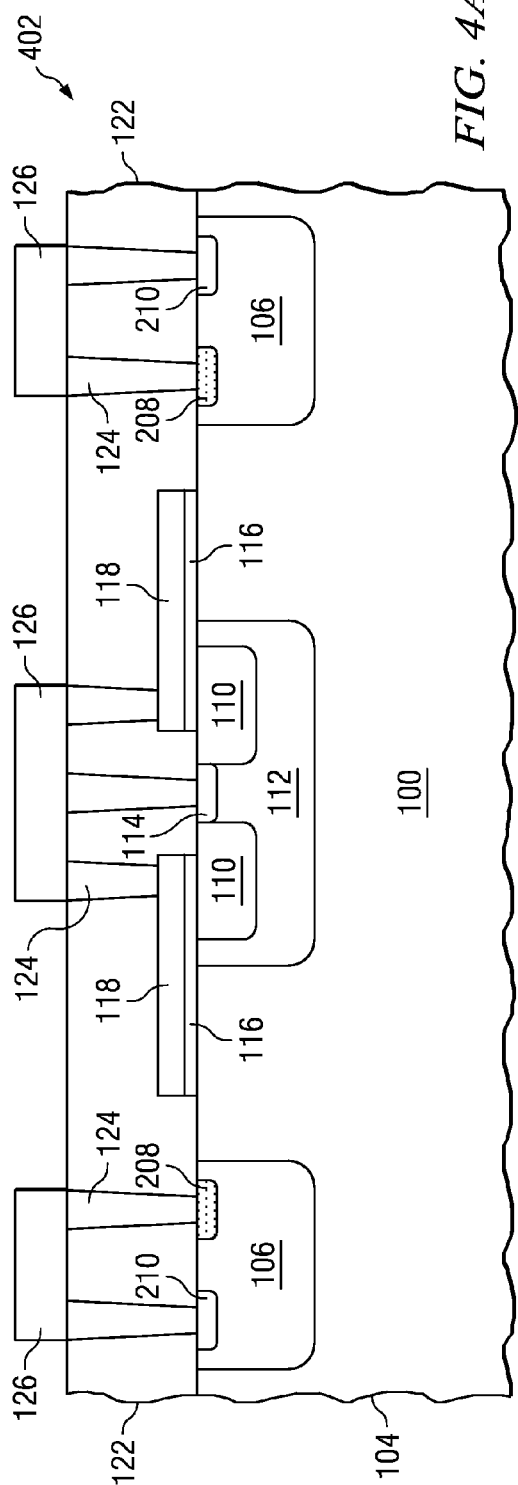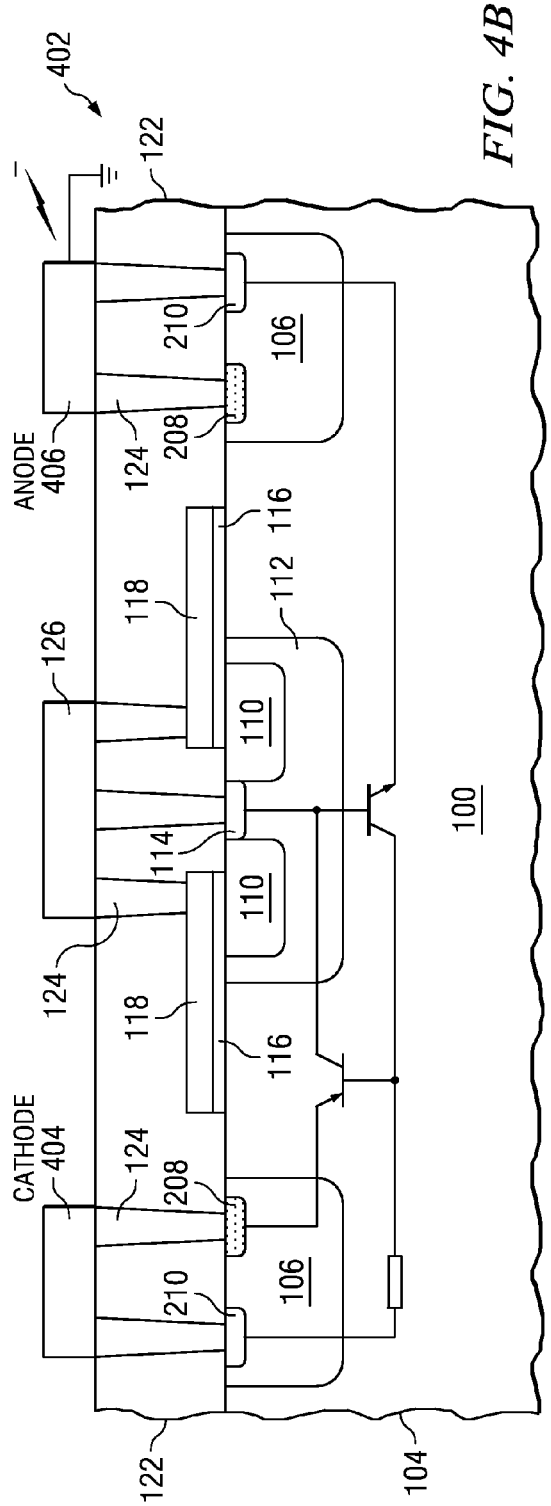

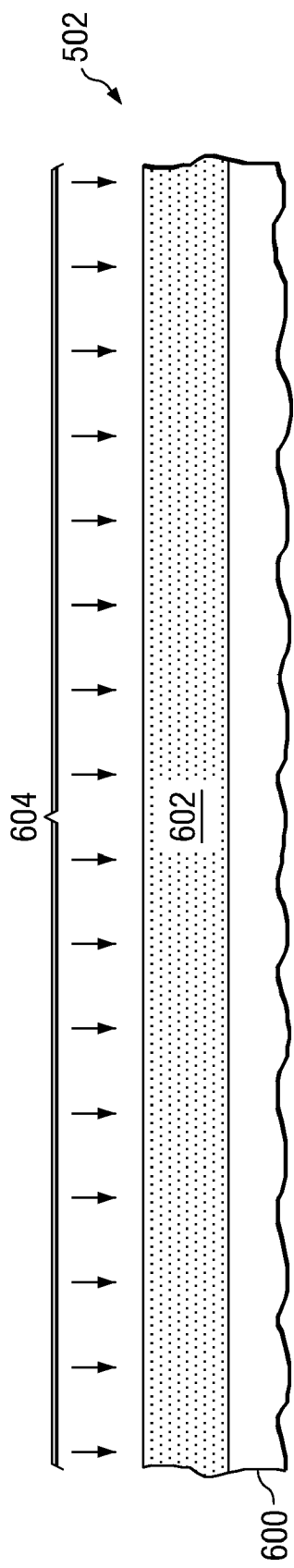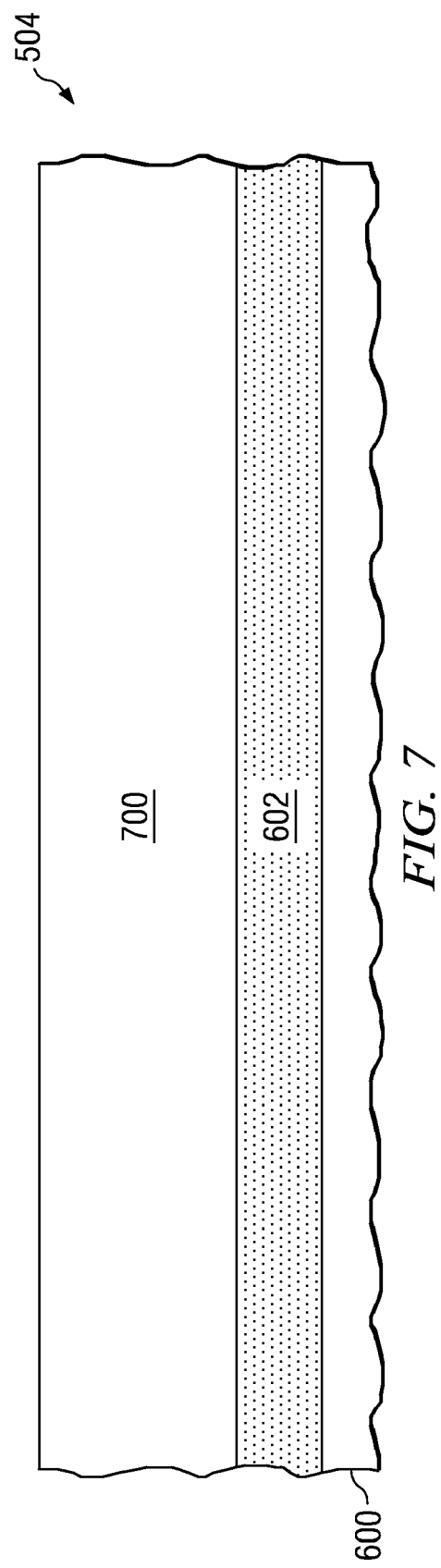

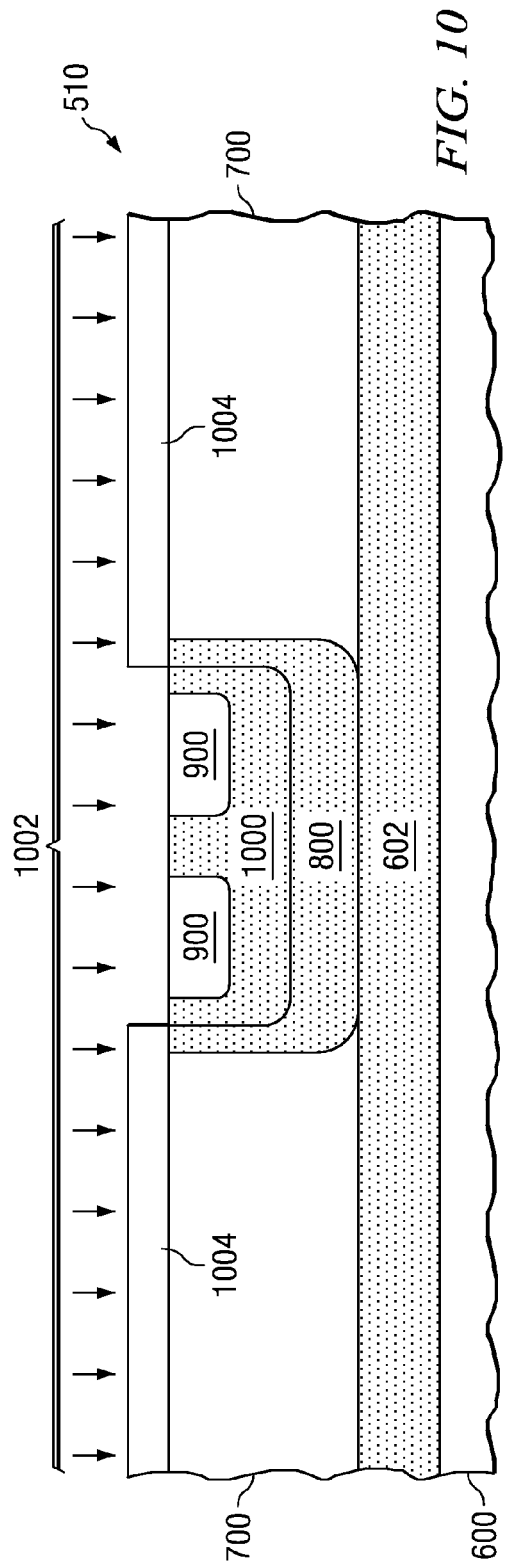
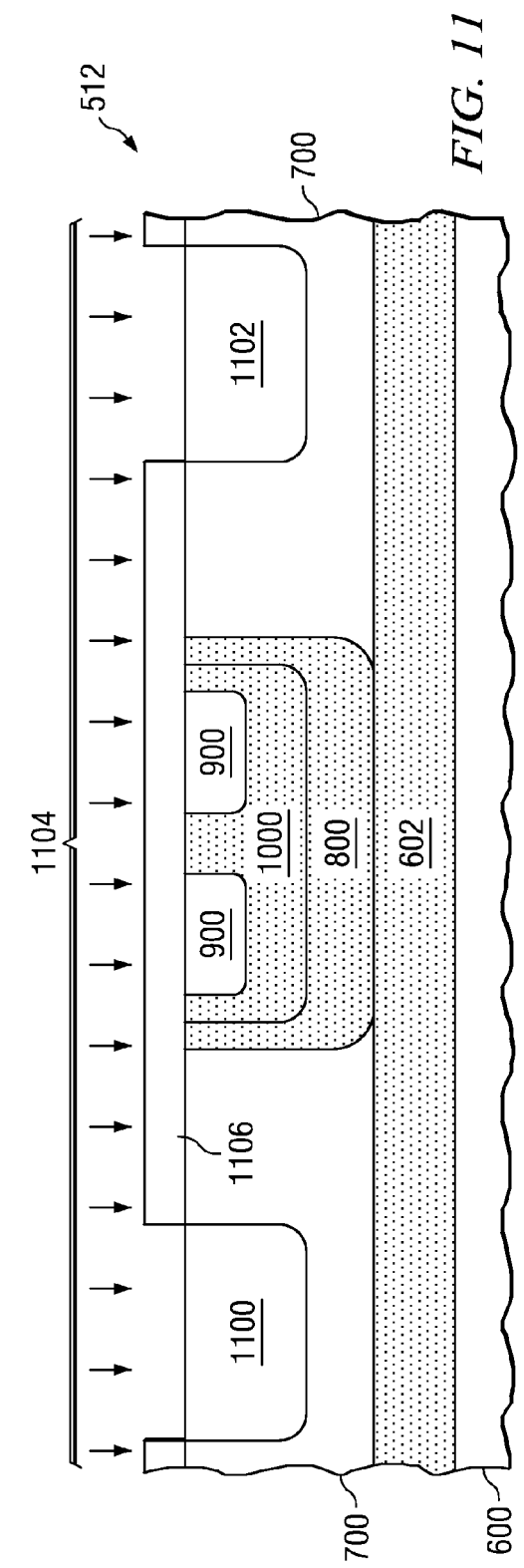

US 7,786,507 B2

SYMMETRICAL BI-DIRECTIONAL SEMICONDUCTOR ESD PROTECTION DEVICE

FIELD

The disclosure herein relates generally to designing and fabricating a symmetrical bi-directional semiconductor electrostatic discharge (ESD) protection device.

BACKGROUND

Electrostatic discharge (ESD) is a continuing problem in the design, manufacture, and utilization of semiconductor devices. For example, a major source of ESD exposure to ICs is from the human body (described by the "Human Body Model", HBM). In this situation, a packaged IC acquires a charge when it is held by a human who is electro-statically charged (e.g., from walking across carpeting). A charge of about 0.6 µC can be induced on a body capacitance of 150 pF, for example, leading to electrostatic potentials of 4 kV or greater and discharging peak currents of several amperes to the IC for about 100 ns, for example. A second source of ESD is from metallic objects (described by the "Machine model", MM), which is characterized by a greater capacitance, lower internal resistance and transients that have significantly higher rise times and current levels than the HBM ESD source. A third source is described by the "charged device model" (CMD), in which the IC itself becomes charged and discharges to ground in rise times less than 500 ps in the opposite direction than the HBM and MM ESD sources. Furthermore, different types of electrical overstresses during circuit operation are defined in standards dedicated to specific applications like automotive systems.

During ESD events, current is typically discharged between one or more pins or pads exposed to the outside of an IC chip. Such ESD current flows from the pad to ground through vulnerable circuitry in the IC, which may not be designed to carry such currents. Many ESD protection techniques have been employed to reduce or mitigate the adverse effects of ESD events in integrated circuit devices. Many conventional ESD protection schemes for ICs employ peripheral circuits to carry the ESD currents from the pin or pad of the device to ground by providing a low impedance path thereto. In this way, the ESD currents flow through the protection circuitry, rather than through the more susceptible circuits in the chip. In some cases it is also possible to make a device of weak intrinsic ESD robustness self-protecting by some device design modifications which do not impact significantly device function under normal operation.

ESD protection devices, circuits or self protecting elements are typically connected to I/O and other pins or pads on the IC, wherein the pads further provide the normal circuit connections for which the IC was designed.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

The present invention relates to designing and fashioning a 2-terminal (i.e., anode, cathode) symmetrical bi-directional semiconductor electrostatic discharge (ESD) protection device is disclosed. The symmetrical bi-directional semiconductor ESD protection device design comprises a first and second shallow wells symmetrically spaced apart from a central floating well. Respective shallow wells comprise a first and a second highly doped contact implant with opposite doping types (e.g., n-type and p-type). One or more field plates extend laterally outward from above the central floating well, whereby the field plates are connected to the floating well. The device can be used as an ESD protection device at a bi-directional I/O, like for example in parallel with a symmetrical MOS to be protected. Upon an ESD event at an input node comprising the first and second shallow wells, a coupled npn-pnp bipolar component comprising the center well, the first and second shallow wells, and the first and second contact implants, is triggered, thereby shunting current from the at the first shallow well to the second shallow well. Other embodiments are also disclosed.

To the accomplishment of the foregoing and related ends, the following description and annexed drawings set forth certain illustrative aspects. Other aspects, advantages and/or features may, however, become apparent from the following detailed description when considered in conjunction with the annexed drawings.

BRIEF DESCRIPTION OF THE DRAWINGS

FIG. 1A illustrates an n-type drain extended MOS (DEMOS) device;

FIG. 1B illustrates a p-type drain extended MOS (DEMOS) device;

FIG. 2C illustrates the internal circuit schematic for the disclosed device of FIG. 2A, including the anode and cathode terminals, for an n-type device having a positive voltage stress at the cathode electrode;

FIG. 2D illustrates a two transistor analogy of the device of FIG. 2A;

FIG. 3A illustrates a cross-section of another embodiment of the disclosed invention with STI field oxide isolation under the inside field plate edge;

FIG. 3B illustrates a cross-section of another embodiment of the disclosed invention with no STI field oxide isolation;

FIG. 3C illustrates a cross-section of another embodiment of the disclosed invention with STI field oxide isolation under the inside and outside field plate edges;

FIG. 3D illustrates a cross section of another embodiment of the disclosed invention with the symmetric shallow wells extending to the center deep well;

FIG. 4A illustrates a cross-section of another embodiment of the disclosed invention with STI field oxide isolation under the field plate inside edges;

FIG. 4B illustrates the internal circuit schematic for the disclosed device of FIG. 4A, including the anode and cathode terminals, for a p-type device having a negative voltage stress at the cathode electrode;

FIGS. 6-17 illustrate cross-sectional views of the semiconductor substrate formed in the method of FIG. 5.

DETAILED DESCRIPTION OF THE INVENTION

Figure 2A:
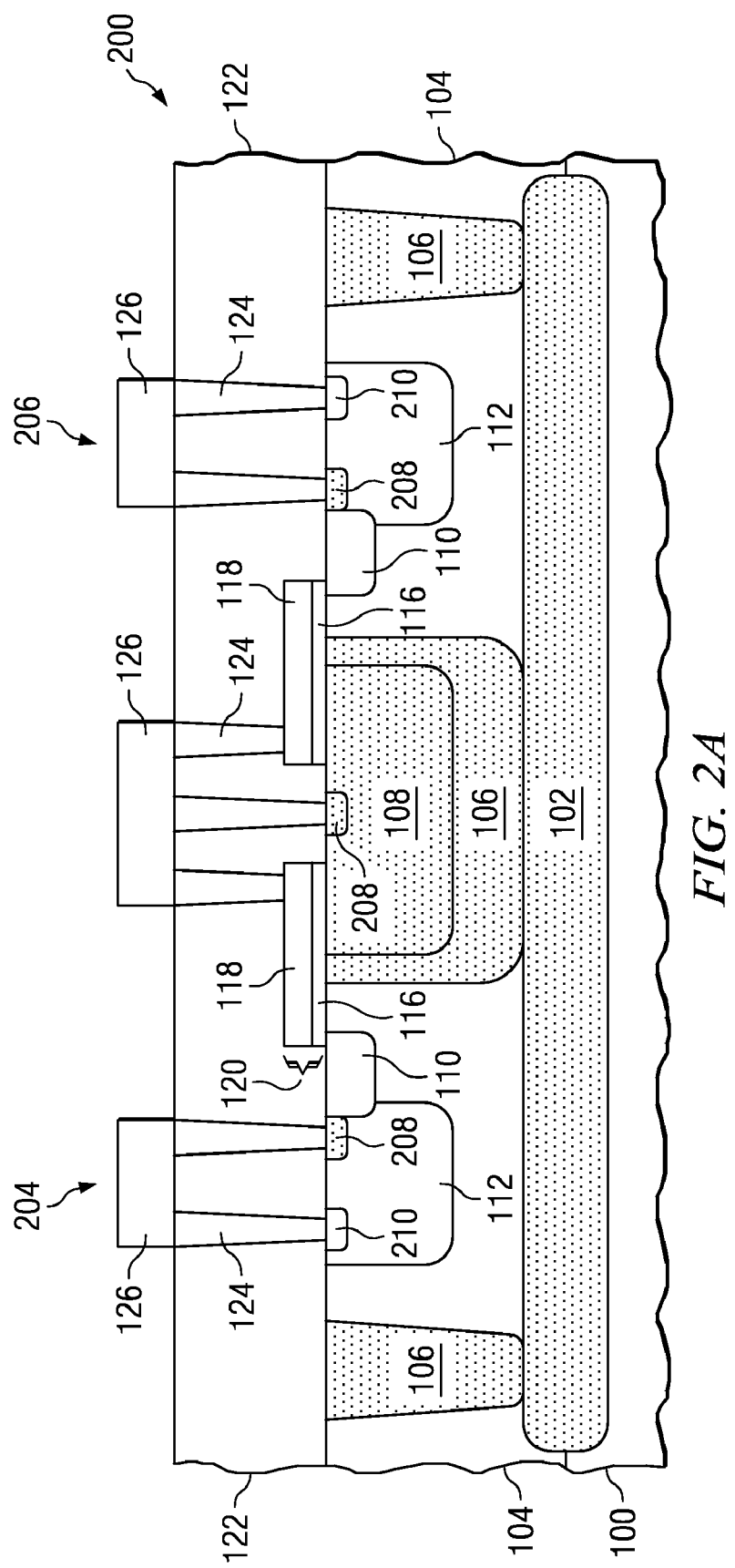
FIG. 2A illustrates a cross-section of one embodiment of the present invention, a symmetrical bi-directional semiconductor electrostatic discharge (ESD) protection device with STI field isolation between a field plate and anode/cathode.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In the examples of this disclosure, it is supposed that semiconductor regions are doped using either dopant implantation or deposition of a doped material at the surface of the semiconductor material followed by diffusion into the semiconductor material. Patterned doped regions are assumed to be obtained by means of traditional lithographic techniques, for example, where lithography broadly refers to processes for transferring one or more patterns between various media.

In the last 20 years, the increasing need for advanced Smart Power circuits integrating power drivers, high density logic control units, high precision analog circuits and various memories in single chip solutions to be used in increasingly harsh environments has made the development of robust and compact ESD protection devices highly desirable.

Symmetrical drain extended MOS devices are used at terminals of which the output voltage can vary between opposite polarities. Uni-directional ESD protection devices can be connected back to back to realize bi-directional protection for this type of outputs, or integrated bi-directional ESD protection devices can be used. The breakdown voltage of both devices to be protected and of the parallel protecting devices vary against process and alignment variations during fabrication. In case the designs of the protecting and protected devices are very different (because thy use different layers and or layouts), their breakdown variations across the fabrication window may not correlate well, so that extra margins have to be built-in in breakdown voltage of the protected device to make sure that the protecting device does not trigger during operation. Therefore, it would be advantageous to have symmetrical ESD protection devices which closely correlate to state of the art DEMOS transistors.

FIGS. 1A and 1B illustrate traditional drain extension MOS (DEMOS) devices. FIG. 1A illustrates an n-type DEMOS devices and FIG. 1B illustrates a p-type DEMOS devices. In the example of FIG. 1A, the symmetrical DEMOS transistor comprises a buried layer 102 of first electrical conductivity type formed in a semiconductor body 100 of 1 second electrical conductivity type. An epitaxial layer 104 of second electrical conductivity type is configured above the buried layer 102 and comprises a deep central backgate well 106 of first electrical conductivity type configured between two shallow wells 112 (i.e., source and drain wells) of second conductivity type. The spacing between the shallow wells 112 and the central well 106 (drain extension) determines the drain-source breakdown voltage of the device. Each shallow well 112 comprises a contact implant 114. A gate electrode 118 over a layer of gate oxide 116 extends horizontally along the surface of the EPI layer 104 over the deep well 106. The gate electrode extension over the center well towards the source and drain wells acts as field plate determining the drain-source breakdown voltage of the device in combination with the shallow well to center well spacing. In one embodiment, this gate electrode extension can be terminated above a thick field oxide 110 to avoid premature breakdown of the thin gate dielectric. The device of FIG. 1A also comprises a deep well ring 106 over buried layer 102, which contacts or overlaps the center well (see for example FIG. 2B) as to isolate the source/drain wells from the EPI layer and from the semiconductor body of same conductivity type.

In the example of FIG. 1B, the symmetrical DEMOS transistor comprises a central well 112 of the second electrical conductivity type formed in a semiconductor body 100 of the second electrical conductivity type. The central well 112 is configured between two shallow wells 106 (i.e., source and drain wells) of first electrical conductivity type. The spacing between the central well 112 and the shallow wells 106 determines the drain-source breakdown voltage of the device. Each shallow well 106 comprises a contact implant 114. A gate electrode 118 over a layer of gate oxide 116 extends horizontally along the surface of the semiconductor body 100 over the central well 112. The gate electrode extension over the central well 112 towards the source and drain wells acts as field plate determining the drain-source breakdown voltage of the device in combination with the shallow well to center well spacing. In one embodiment, this gate electrode extension can be terminated above a thick field oxide 110 to avoid premature breakdown of the thin gate dielectric.

FIG. 2A shows a first embodiment of the disclosed symmetrical bi-directional semiconductor electrostatic discharge (ESD) protection device 200. In this embodiment, a buried layer 102 having a first electrical conductivity type (e.g., n or p) is formed in a semiconductor body 100 having a second conductivity type (e.g., p or n). Above the buried layer 102 is an epitaxial (EPI) layer 104. In one embodiment the EPI layer has the second electrical conductivity. In an alternative embodiment, the EPI layer 104 can have the first electrical conductivity type and be counter-doped to the second conductivity type by implantation. Within the EPI layer 104 is a deep well 106 having the first electrical conductivity type. The dopant concentration of the deep well 106 is less than the dopant concentration of the first buried layer 102 as well as the dopant concentration of other subsequently formed wells (i.e., shallow well 108, shallow well 208) having the first electrical conductivity type. The deep well 106 contains an optional shallow well 108 having the first electrical conductivity typed doped at a higher concentration level than the deep well 106.

Figure 2B:
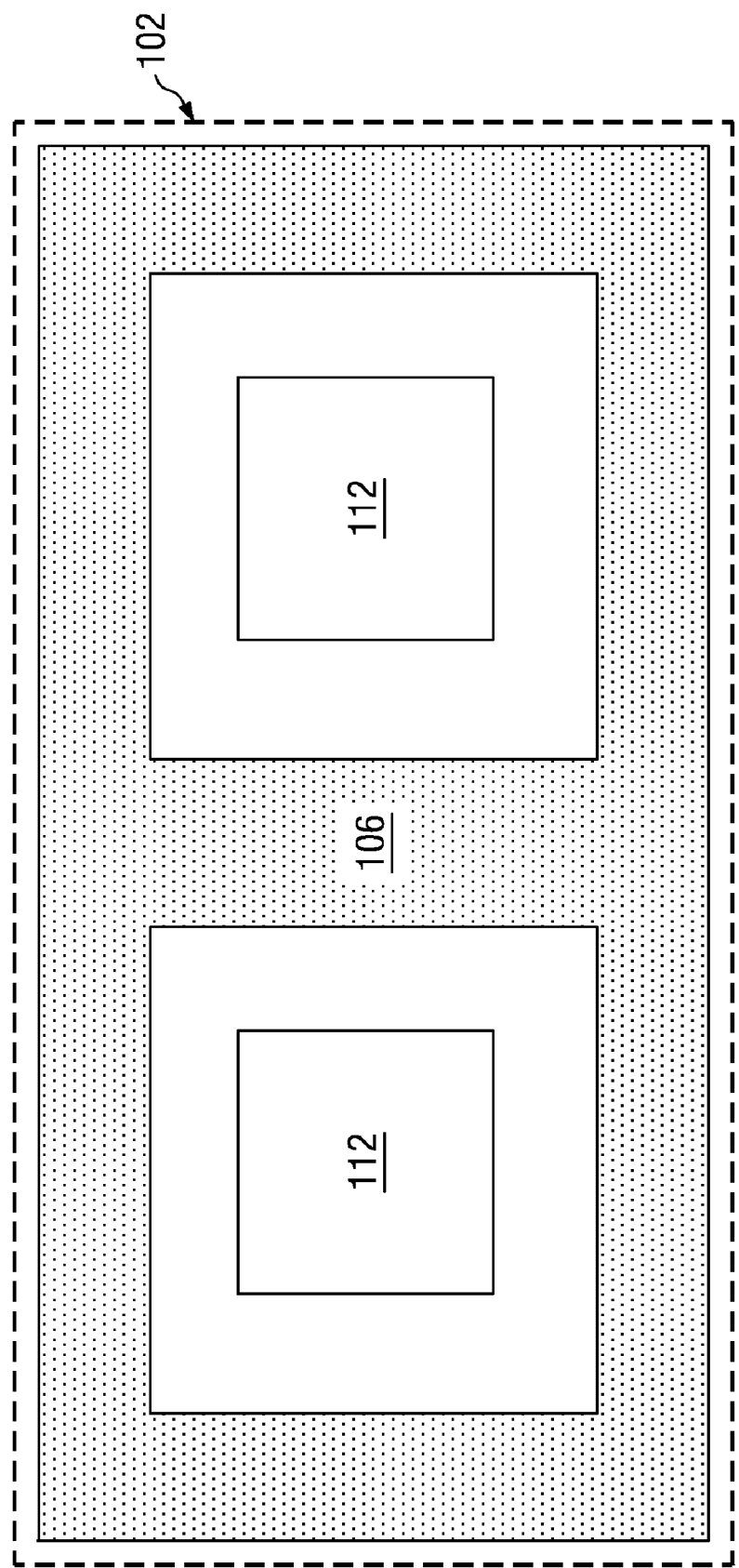
FIG. 2B illustrates a top view of the symmetrical bi-directional semiconductor electrostatic discharge (ESD) protection device of FIG. 2A.
Figure 5:
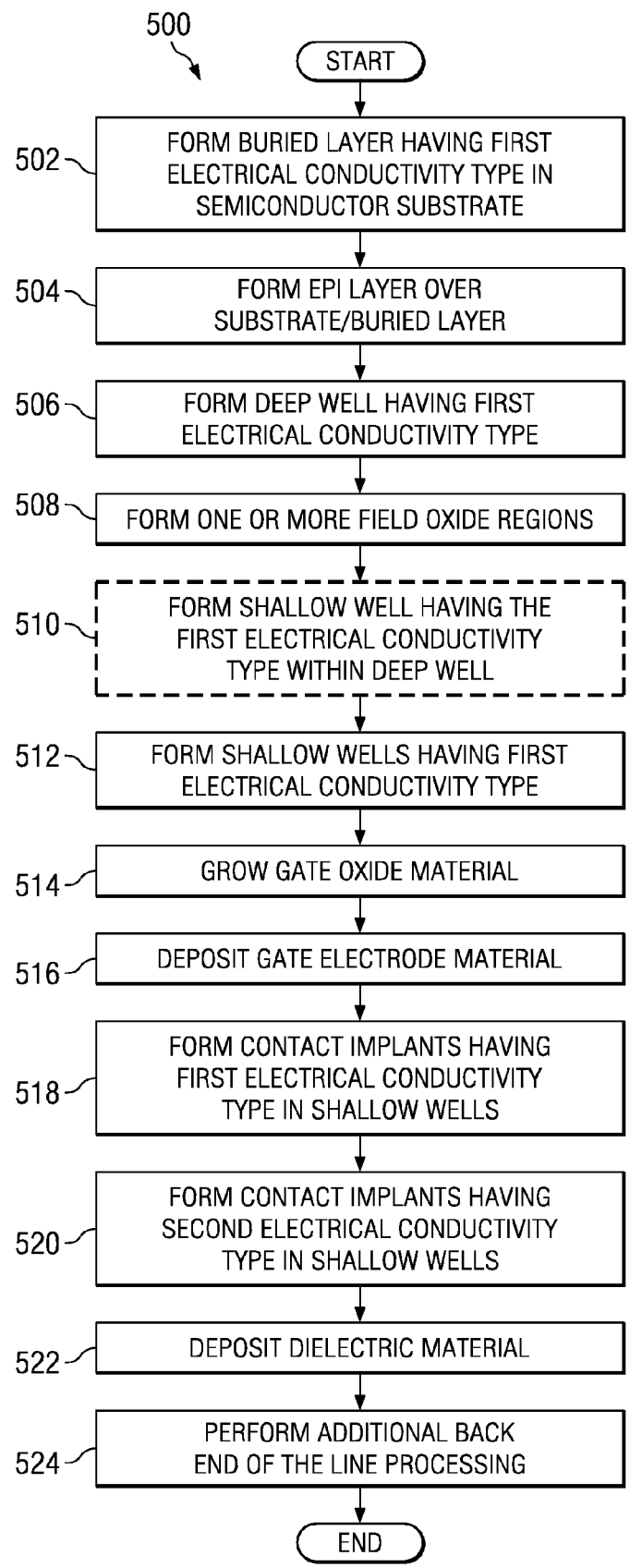
FIG. 5 illustrates of a flow diagram illustrating an exemplary methodology for fashioning a symmetrical bi-directional semiconductor electrostatic discharge (ESD) protection device.
Figure 8:
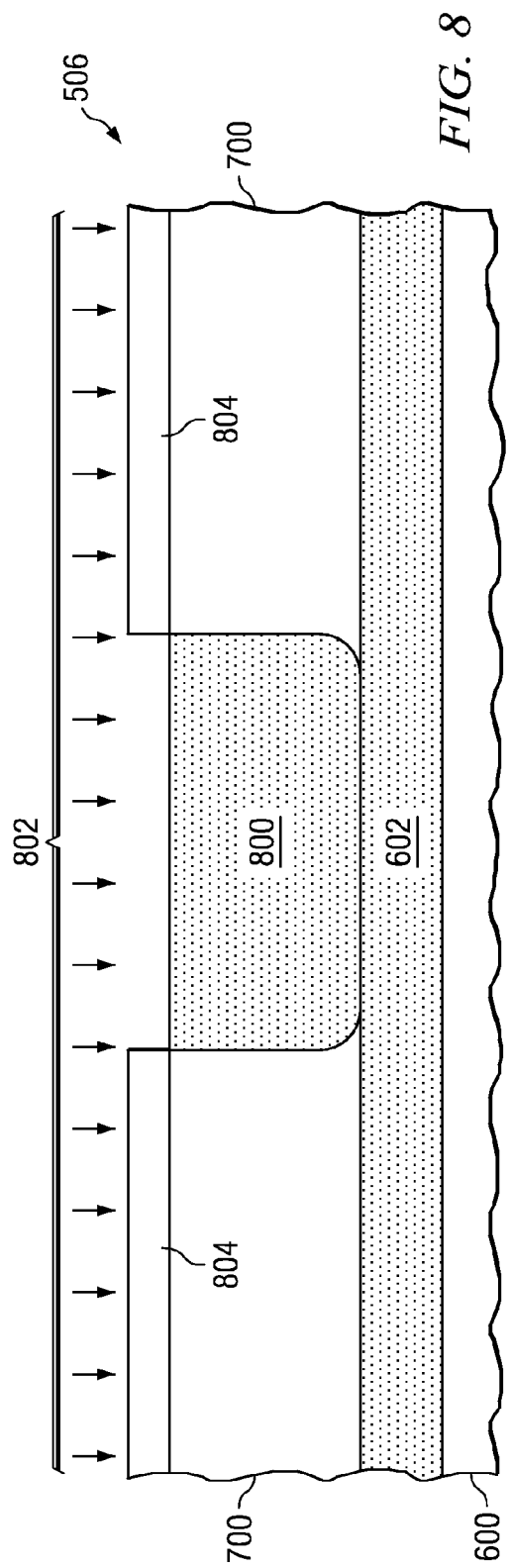

FIG. 2A, deep wells 106 are located at the edges of the buried layer 102. The deep wells 106 overlap the buried layer and with it isolate the cathode 206 and the anode 204 from the EPI layer 104 and substrate 100 which are common to the entire integrated chip. FIG. 2B illustrates a top view of the device of FIG. 2A showing the first and second shallow wells 112 surrounded by a ring of the deep well 106. In an alternative embodiment, a similar design can be obtained by implementing two shallow wells inside of a solid deep well, wherein the shallow wells counter dope the solid deep well.

Referring again to FIG. 2A, the ESD protection device of FIG. 2A is, different from the DEMOS transistor of FIG. 1A, because each shallow well 112 of second conductivity type includes an additional contact implant 208 of first electrical conductivity type to the shallow well (i.e., in addition to the contact implant 210 of the second conductivity type), and because the center well 106 is connected to the field plate 120. In the example of FIG. 2A, the field plate 120 is interrupted in its center in such way that no inversion channel can connect the shallow wells 112. The device comprises coupled NPN and PNP bipolar junction (BJT) components. The field plates 120 are at the same potential as the center well 106, which under ESD stress is about one forward diode threshold voltage (e.g., ~0.7V) lower than the shallow well 112 connected to the terminal of lowest potential. As a result, the field plates 120 have a similar action on the anode-cathode depletion region under positive and negative ESD pulses at the stress electrode. Moreover, the device breakdown behavior correlates closely to the one of a symmetric DEMOS transistor where the gate is at a potential equal or close to the source potential (the max. gate-source voltage is typically a few volts, it is limited by the thickness of the gate dielectric). The device of FIG. 2A generally is suitable to protect bi-directional circuit pins. More specifically, it is suitable as an ESD protection device for a DEMOS of similar layout (see for example FIG. 1A). The anode-cathode breakdown voltage of this device typically varies between a few volts and 200V.

In the embodiment of FIG. 2A, the contact implant of first electrical conductivity type 208 is placed closer to the deep center well 106. In alternative embodiments, the contact implants 208 and 210 may be placed in different orders or locations within the shallow wells 112. Different layouts correspond to different features of the ESD device (e.g., in terms of trigger current and voltage, holding current and voltage, and differential resistance in holding regime).

In the particular example of FIG. 2A, the field plate 120 between the shallow wells 112 and center contact implant 208 comprises a gate oxide layer 116 and a gate electrode layer 118. Field oxide regions 110 (e.g., shallow trench isolation (STI) regions, local oxidized silicon regions) are configured adjacent to the highly doped contact implants 208 comprised within shallow wells 112 and EPI region 104 to support a given anode-cathode breakdown voltage. In one embodiment, the field plate comprises two separate field plates, respectively having an inside edge located above the central deep well and an opposite outside edge located above the field oxide region 110. In an alternative embodiment, the field plate comprises a single field plate with a hole in the center by which contact is made with the first highly doped contact implant 208.

Contact 124 is formed within a dielectric layer 122 and is configured, along with interconnects 126, to electrically couple the highly doped center contact implant 208 to the field plates 120. In one embodiment, contacts to contact implant 208 can be formed in a third dimension at the deep center well ends or over an isolation ring (FIG. 2B) touching the deep well 106. A contact implant region 208 in the center well also interrupts the gate dielectric/gate field plate region in such way that no inversion channel can form between anode and cathode under ESD stress.

During an ESD event at an input node comprising a first shallow well 112 and contact implants 208 and 210, a coupled npn-pnp bipolar component comprising the central deep well 106 the shallow wells 112, and associated contact implants 208 and 210, is triggered, thereby shunting current from the first shallow well to the second shallow well, and causing the one or more field plates to couple to the central deep well.

FIG. 2C illustrates the internal circuit schematic for the disclosed device of FIG. 2A, including p-type anode/cathode 112 wells (i.e., the first electrical conductivity types of the shallow wells is p-type), for a p-type device (i.e., from the DEMOS: source and drain are p-type, inversion type is p in center nwell) having a positive voltage stress at the cathode electrode. As shown in FIG. 2C, the proposed device has two terminals: an anode 204 comprising a shallow well 112 and contact implants 208 and 210 and a cathode 206 comprising a shallow well 112 and contact implants 208 and 210. The field plates 120 and contact implant 208, comprised within deep well 106, are floating (i.e., not linked to an IC terminal).

The anode 204 and cathode 206 are symmetric with each other relative to the floating deep well 106. During ESD strike one of the junctions well 112 to deep well 106 is forward biased, the voltage transferred to the contact implant 208 in the center of the deep well 106 is carried over to the field plates 120. The field plate 120 on the side of the depleting junction (e.g., deep well 106 to shallow well 112) acts as a field plate similarly as in a symmetrical DEMOS transistor of same type. Because of its similarity of design with a standard symmetrical DEMOS transistor, the device can be used as a protection ESD device for symmetrical DEMOS transistors with tight margins (there is no need to over-size the breakdown voltage of the DEMOS transistors in order to protect them). A DEMOS ESD protection device fashioned as described herein has a holding voltage tunable by the layout and doping of the shallow wells 112 and deep well 106, by the position and density of the contact implants, and by the position of the field plates. The device design makes it particularly suitable for Smart Power technology applications. High robustness is obtained as a result of the coupling of the bipolar component A (emitter=208 in the shallow well 112 at the lowest potential terminal, base=210, 112, 104 of the same terminal, collector=106, 208) to the bipolar transistor B of opposite type (emitter=210, 112 and 104 at the terminal of highest potential, base=106, 208, collector=210, 112 and 104 at the terminal of lowest potential) as shown in FIG. 2C and FIG. 2D. The device does not have any connected MOS channel, but the field plates 120 and the overall layout style are used to make it correlate in breakdown with symmetrical DEMOS devices to be ESD protected.

The effective gain of the bipolar component A can be significantly varied, for example by tuning of its base resistance, for example by varying the density of contact implants 208 and 210. Also, increasing the spacing between the electrodes and the edge of the well of first type comprising the center contact implant 208 (e.g., 106, 108 in FIG. 2A) decreases the gain of component A which can result in a better balance between A/B components and influence the current homogeneity under ESD surge. Such balance can also be reached by adding some emitter ballast to component A, for example by decreasing the number of contacts to non-salicided contact implants 208 in well 112 and herewith adding some emitter drift resistance through these regions. Similarly, the length of the highly doped implant 208 can be increased to increase the device effective gain by increasing the internal base resistance and the emitter area.

The coupling between the two bipolar components A and B (FIG. 2C) influences the holding voltage of the device (e.g., npn pnp turns into SCR action or thyristor action with low sustaining voltage around when the product of the respective bipolar component gains beta(A)*beta(B)>1). A high holding voltage is obtained with a weaker coupling of A and B. It is, for example, suitable for automotive pin applications where the device may not snap-back under the battery voltage of the car (14-18V) in the case of an ESD surge arising during car operation. In some applications though, an ESD component is allowed to have a very low holding voltage, either because of the low battery voltage or because the trigger current of the ESD component is higher than a certain limit which is typically set by latch-up requirements. In such case a strong A-B coupling can be realized in the device, resulting in a so-called SCR (silicon controlled rectifier) action. Both SCR and weakly coupled bipolar pair concepts have been demonstrated in the literature to achieve better ESD robustness than simple bipolar devices.

FIG. 2D shows a simplified two transistor analogy SCR device of FIG. 2C, wherein the first electrical conductivity type is n and the second conductivity type is p. The base current of the NPN transistor depends on the collector current of the PNP transistor and the collector current of the NPN transistor drives the base current of the PNP transistor. The formation of an SCR from a DEMOS device is valuable in relation to ESD as SCR devices have shown robust ESD behavior. The need for robust ESD behavior is extremely important in integrated circuits as the ESD protection of a DEMOS device narrows as the device are sized more aggressively.

There are many variations which can be made to the device of FIG. 2A to vary its performance. Alternative embodiments of the symmetric bi-directional semiconductor ESD protection device of this disclosure are shown in FIGS. 3A-3D. These embodiments change the levels present and their geometries used in layouts. While the features of the embodiments are described separately from each other, one skilled in the art would recognize that certain features of one embodiment may be used in conjunction with other features of a separate embodiment.

FIG. 3A shows a symmetrical bi-directional semiconductor ESD protection device wherein the field oxide regions 110 (e.g., STI regions) are formed within the deep well 106 to impede current from flowing in an inversion channel formed at the surface of the center well 106. It will be appreciated that in the device of FIG. 3A the field oxide thickness and the deep center well doping are sufficient to avoid center well surface channel inversion under the maximum device voltage rating. In case the center contact implant 208 in the center well is located at another coordinate along the device width or at the center well ends over an isolation ring (like represented in FIG. 2B), the two STI regions and field plates over them can be merged into a single solid area.

In the embodiment shown in FIG. 3B, a symmetrical bi-directional semiconductor electrostatic discharge (ESD) protection device 302 is configured not to have field oxide regions.

In yet another alternative embodiment, shown in FIG. 3C, a symmetrical bi-directional semiconductor electrostatic discharge (ESD) protection device is configured to comprise field oxide regions 110 within either the first shallow well 108 or the deep well 106 and under an edge of the field plate 120 adjacent to the highly doped contact implant 208. In some embodiments, the field oxide 110 can be continuous between the shallow wells 112 and the center well 106, so that there is no thin gate oxide region in the device.

FIG. 3D shows an embodiment of the present invention comprising shallow wells 112 which extend to the deep well 106 of the device. The spacing between shallow well 112 and center well 106 can be varied according to the desired device performances (including breakdown voltage). Alternatively, the shallow wells 112 can overlap into the deep well 106 or shallow well 108.

It will be appreciated that the device can be laid out with other geometries than the rectangular one illustrated in FIG. 2B. The device can have a polygonal, circular or racetrack type of geometry, with a shallow well in the center, an annular shallow well around it and an annular deep well between them. Another deep well ring can surround the outside shallow well ring to isolate it from an EPI or semiconductor body of same conductivity type.

It will be appreciated that the variations shown in FIGS. 3A-3D are not limiting and embodiments may comprise elements from different figures. For example, a symmetrical bi-directional semiconductor electrostatic discharge (ESD) protection device having no field oxide regions (e.g., FIG. 3B) may be configured to have drain extensions into the deep well (e.g., FIG. 3D).

FIG. 4A shows an anode/cathode deep well 106 device. As shown in FIG. 4A, the deep wells 106 are horizontally spaced apart from a central shallow well 112. The highly doped contact implants 208 and 210 are located within respective deep wells 106. In one embodiment, the deep well 106 has an n-type doping and the central shallow well 112 has a p-type doping.

FIG. 4B illustrates the internal circuit schematic for the disclosed device of FIG. 4A, including n-type anode/cathode 446 wells 106 (i.e., the first electrical conductivity type is n-type), for an n-type device having a negative voltage stress at the cathode electrode.

An exemplary methodology 500 for forming a symmetrical bi-directional semiconductor electrostatic discharge (ESD) protection device is illustrated in FIG. 5, and FIGS. 6-17 are cross sectional views of a semiconductor substrate 400 wherein such a method is implemented. While the method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

At the outset, a buried layer region 602 having a first electrical conductivity type (e.g., n or p type) is formed in the semiconductor substrate 600 at 502 (FIG. 4). The buried layer 602 can be formed, for example, by forming and patterning a photoresist (not shown) over the substrate 600 and performing a first implantation 604 of one or more dopants into the substrate 600. The buried layer is usually heavily doped (e.g., ~1E19 cm⁻) to minimize the drain resistance of the DEMOS component. In technologies using deep trench isolation as opposed to junction isolation, the buried layer implant can be made over the complete chip area (blanket implant, no mask is necessary).

It will be appreciated that substrate as referred to herein may comprise any type of semiconductor body (e.g., silicon, SiGe, SOD such as a semiconductor wafer or one or more die on a wafer, as well as any other type of semiconductor and/or epitaxial layers formed thereon and/or otherwise associated therewith.

At 504 an epitaxial or EPI layer 700 having the second electrical conductivity type is formed (e.g., grown) over the surface of the substrate 600 and buried layer 602 (FIG. 7). The depth of the grown EPI layer 700 depends on the voltage rating of the device, it is typically between 2 um and 15 um in the 20V-200V range. The EPI layer 700 may have the second electrical conductivity type as formed and/or one or more dopants may be subsequently added thereto to instill the second electrical conductivity type in the EPI layer 700. In any event, the dopant concentration of the EPI layer 700 is less than the dopant concentration of the first buried layer 602 as well as the dopant concentration of other subsequently formed wells (e.g., shallow wells, deep wells). Processing conditions associated with forming the EPI layer 700, such as elevated temperatures, for example, may promote some buried layer diffusion.

The term epitaxial layer of as used in this disclosure is intended as a broadly reaching term and is not meant to solely comprise epitaxially grown layers. While the device of this disclosure may be built using an epitaxial layer, it does not require the use of an epitaxially grown layer. Non-epitaxially grown layers (like Silicon over Insulator layers) which are doped to have the first electrical conductivity may comprise a layer equivalent to the epitaxial layer as referred to in this disclosure. The inventors have contemplated the use of a wide range of materials which may comprise the epitaxial layer of the disclosure.

A deep well having the first electrical conductivity type is implanted into the buried layer at 506. The deep well 800 may be formed by depositing and patterning a photoresist 804 over the EPI layer 700 and performing an implantation 802 of one or more dopants into the masked EPI layer 700. The deep well 800 will diffuse into the EPI 700 spanning from the top of the EPI 700 to the buried layer 602.

Figure 9:
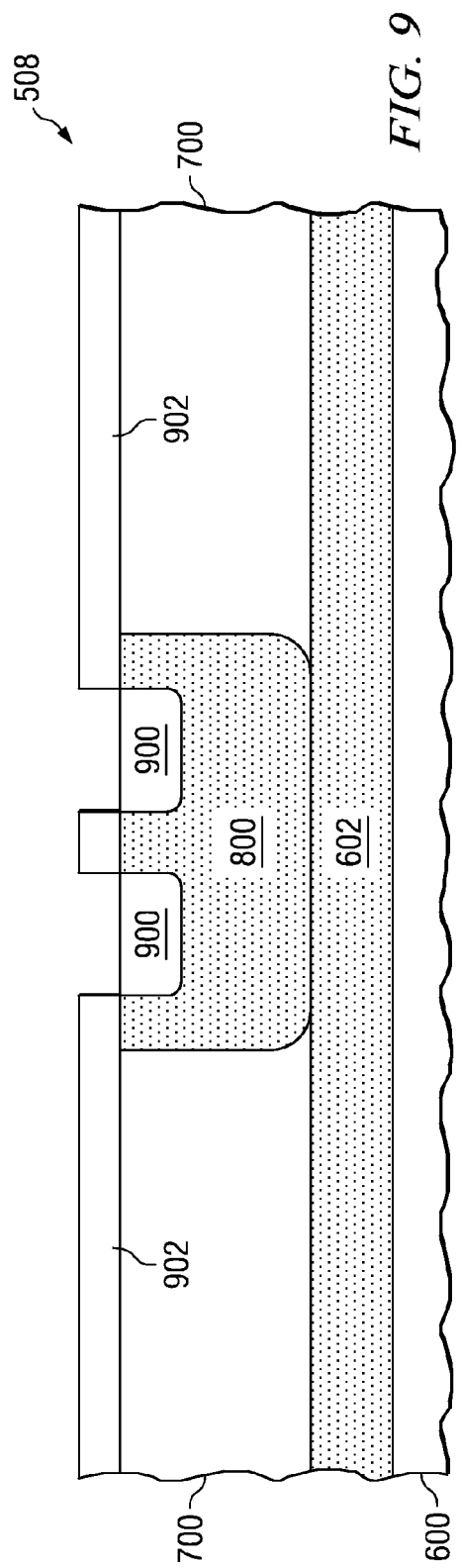
Figure 12:
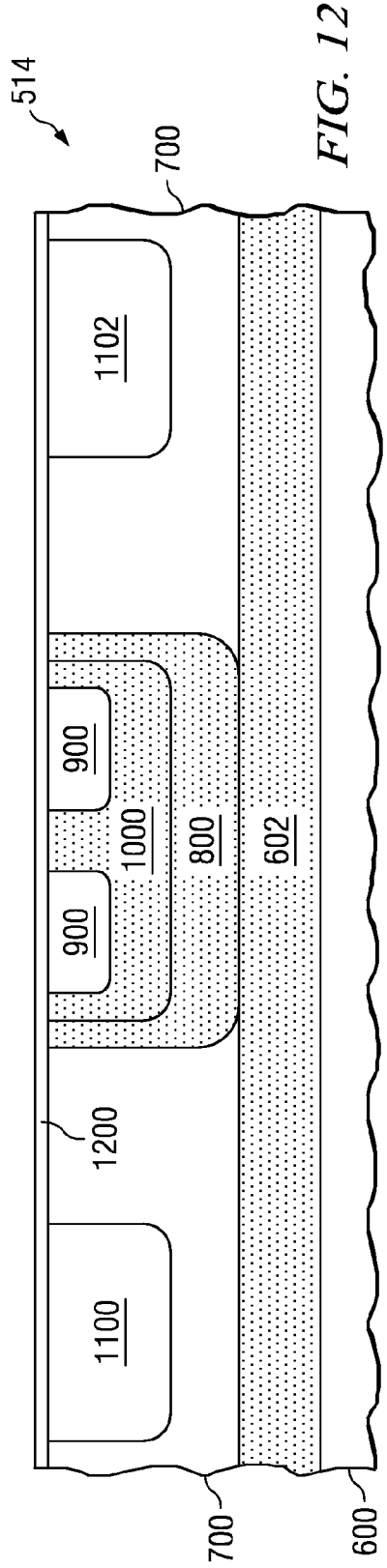

One or more field oxide regions 900 are formed in at 508. As shown in FIG. 9, the field oxide regions comprise STI trenches. The STI trenches can be formed by etching shallow trenches on opposite sides the deep well 800. The shallow trenches can, for example, be formed by etching the substrate with a plasma. Once the shallow trenches are formed an oxide is deposited on the surface of the substrate to fill the trench. The oxide is planarized to the level of the surface of the substrate using chemical mechanical polishing (CMP) leaving oxide only in the trench and forming two field isolation regions 900 (i.e., STI regions).

A 510 an optional shallow well is implanted into the deep well region. The shallow well 1000 will have the first electrical conductivity type and have a higher doping then the deep well. In the standard DEMOS of FIG. 1A the shallow well can be used to tune the threshold voltage. As shown in FIG. 10, the shallow well 1000 may be formed by depositing and patterning a photoresist 1004 over the EPI layer 700 and performing an implantation 1002 of one or more dopants into the deep well 800.

A first and second shallow wells 1102 and 1104 having the second electrical conductivity type are then formed in the EPI layer 700 at 512 (FIG. 11). The shallow wells 1102 and 1104 are formed in locations flanking on both sides of the deep well 800. In one embodiment the first and second shallow wells 1102 and 1104 extend to overlap or abutting the deep well 800. In another embodiment the first and second shallow wells 1102 and 1104 are spaced apart from the deep well 800. The spacing between the shallow wells 1102 and 1104 and the deep well 800 is the drain extension where the voltage is dropped between anode and cathode during ESD discharging across the device.

In one embodiment, the symmetrical bi-directional semiconductor device is symmetric around the deep well 800 region having the first and second shallow wells 1102 and 1104 spaced equally from the deep well 800. In a different embodiment the device is asymmetric about the deep well region 800 having the first and second shallow wells 1102 and 1104 spaced unequally from the deep well 800.

At 514, a blanket layer of gate oxide (e.g., gate dielectric) material 1200 is formed on the EPI layer 700. The layer of gate dielectric material 424 generally comprises an oxide (or other dielectric) based material and/or a high-k material, for example, and is relatively thin, being formed to a thickness of between about 1 nm and about 20 nm, for example.

Figure 13:
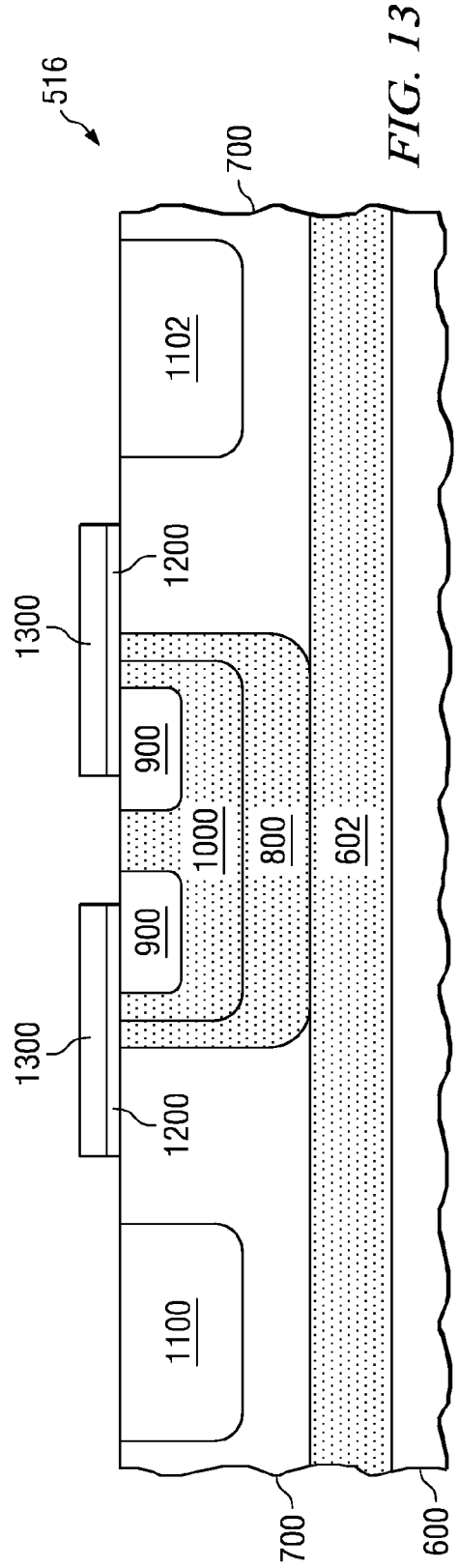

A layer of gate electrode material 1300 is formed over the gate dielectric material 1200 at 516 (FIG. 13). In one embodiment, the gate electrode material is covered with a masking photoresist layer. The masking photoresist layer is patterned and then the gate electrode material and gate dielectric material are selectively etched. In an alternative embodiment, an intermediate hard mask may be used selectively etch the gate electrode and dielectric materials. In one embodiment, the layer of gate electrode material 1300 comprises a polysilicon (or other semiconductor) based material, and is formed to a thickness of between about 100 nm and about 300 nm, for example.

Figure 14:
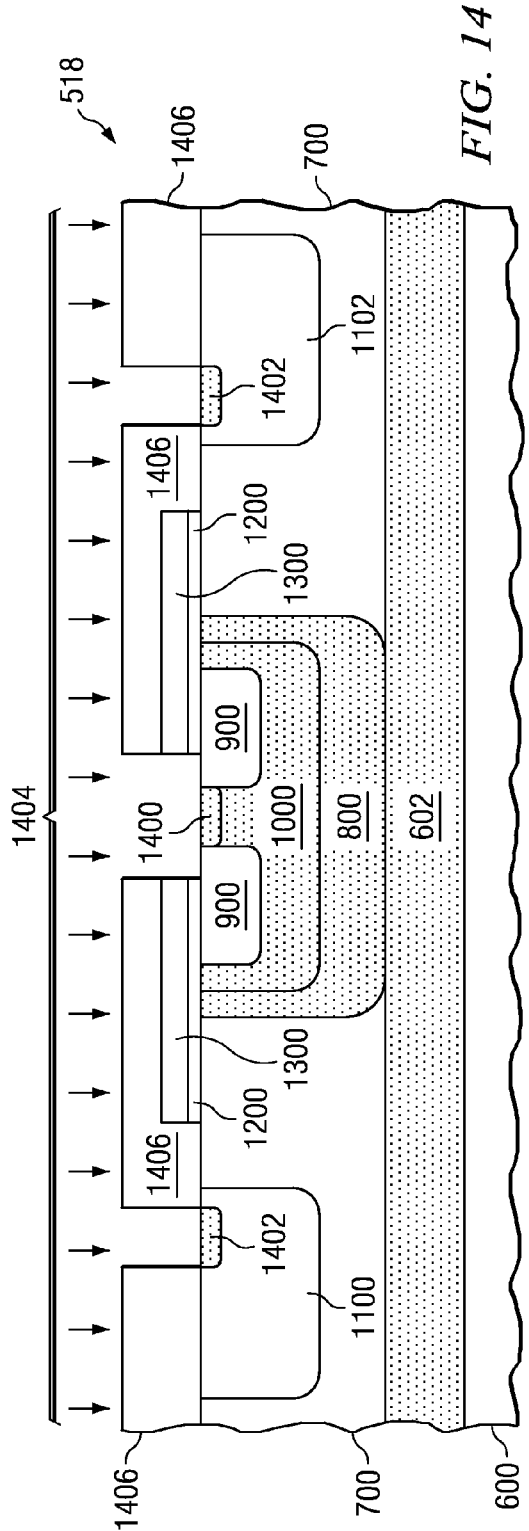
Figure 15:
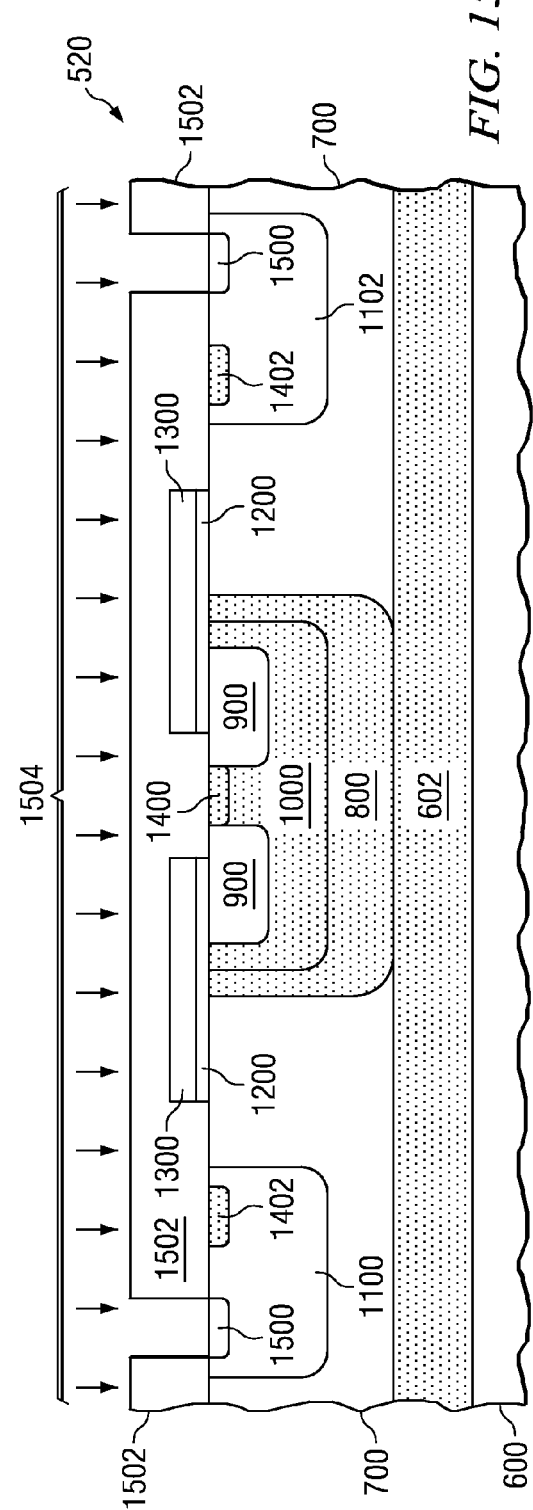
Figure 16:
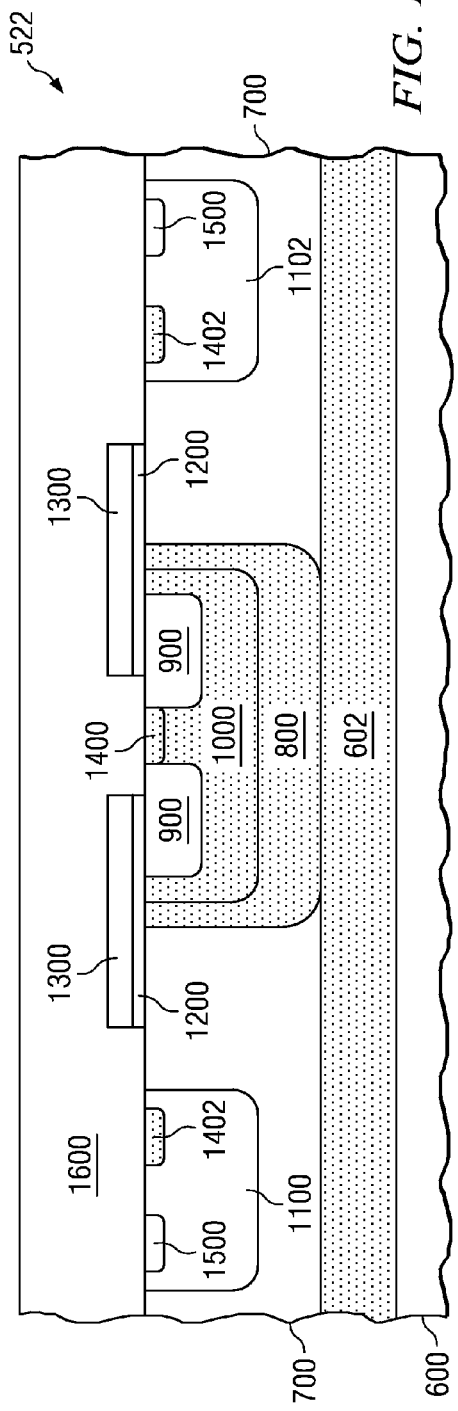
Figure 17:
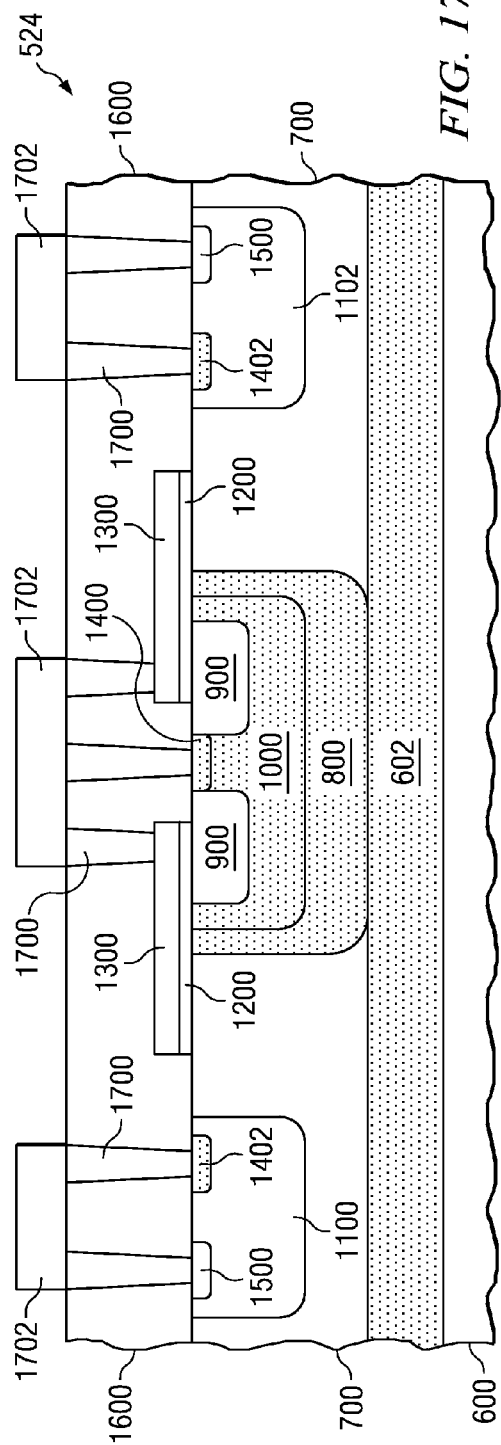

A plurality of contact implants having a first electrical conductivity type are formed at 518. Contact implants are formed in the shallow wells 1100 and 1102 and in the deep well 800. Contact implants 1400 and 1402 are formed by an implant to have the first electrical conductivity type (FIG. 14). Since the contact implants 1400 and 1402 are formed over/within shallow wells 1000, 1100, and 1102, respectively, the contact implants 1400 and 1402 have a concentration of first electrical conductivity type (e.g., n or p type) dopants that is sufficient to overpower/overcome the concentration of second electrical conductivity type (e.g., p or n type) dopants comprise in shallow wells 1000, 1100, 1102 in this area of the EPI layer 406. For example, contact implants 1400 may be formed with a peak concentration of 1E19 $cm^-$. Contact implant 1400 can, for example, it can be the same layer as used for the drain/source diffusions of low-voltage MOS transistors and can be heavily doped (e.g., peak doping ~1E20 $cm^-$) to provide a low-ohmic contact to the deep well 800. In a standard smart power process, the shallow wells 1100 and 1102 can be the source layer of DMOS transistors or the source/drain implant of low-voltage MOS transistors.

At 520 contact implants having a second conductivity type are formed in the shallow wells 1100 and 1102. The contact implants 1500 are heavily doped with the second conductivity type such that the doping concentration of the contact implants 1500 is greater than the dopant concentration of the shallow wells 1100 and 1102.

At 522 a dielectric material 1600 is formed above the EPI layer. The dielectric material may comprise a low k dielectric.

At 524 additional back end of the line process is performed. Additional back end of the line process may comprise formation of contacts, metal lines, and vias. In one embodiment, contacts are formed by selectively etching contact holes (e.g., via a photoresist mask) into the dielectric material 1600 and filled the etched holes with a metal. Each contact implant has an associated contact connecting it to further metallization (e.g., copper metal levels). Contact implants 1402 and 1500 comprised within the shallow wells 1100 are electrically coupled to form the anode of the device. Contact implants 1402 and 1500 comprised within shallow well 1102 are electrically coupled to form the cathode of the device. Fashioning a symmetrical bi-directional semiconductor ESD protection device as described herein can be readily integrated into a standard BiCMOS, High-Voltage CMOS (HVCMOS) or a smart power technology fabrication process.

While reference is made throughout this document to exemplary structures in discussing aspects of methodologies described herein (e.g., those structures presented in FIGS. 6-17, while discussing the methodology set forth in FIG. 5), those methodologies are not to be limited by the corresponding structures presented. Rather, the methodologies (and structures) are to be considered independent of one another and able to stand alone and be practiced without regard to any of the particular aspects depicted in the figures. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A symmetrical bi-directional semiconductor electrostatic discharge (ESD) protection device, comprising:
   a central well having a first electrical conductivity type;
   a first shallow well and a second shallow well substantially symmetrically spaced apart from the central well, wherein the first and second shallow wells have a second electrical conductivity type, and wherein respective shallow wells comprise:
      a first contact implant having the first electrical conductivity type;
      a second contact implant having the second electrical conductivity type;
   one or more field plates over an insulating layer configured above the central well and laterally extending in the direction of the first or second shallow well, wherein the one or more field plates are electrically connected to the central well;
   and wherein upon an ESD event at an input node comprising the first shallow well and the first and second contact implants, a coupled npn-pnp bipolar component comprising the central well, the first and second shallow wells, and the first and second contact implants, is triggered, thereby shunting current from the first shallow well to the second shallow well and causing the one or more field plates to be coupled to the central well.

2. The ESD protection device of claim 1, wherein the first contact implant comprised within the first and second shallow well is located at a shorter distance from the central well than the second contact implant.

3. The ESD protection device of claim 1, wherein the second contact implant comprised within the first and second shallow well is located at a shorter distance from the central well than the first contact implant.

4. The ESD protection device of claim 1, wherein the central well comprises a central contact implant having the first electrical conductivity type.

5. The ESD protection device of claim 1, wherein the one or more field plates comprise a single field plate configured to extend over the central well and comprising an opening exposing central well.

6. The ESD protection device of claim 1, wherein the one or more field plates comprise two separate field plates, respectively extending from an inside edge located above the central well to an opposite outside edge.

7. The ESD protection device of claim 1, wherein the central well is comprised within a semiconductor body having the same conductivity type as the central well.

8. The ESD protection device of claim 1, wherein the central well is comprised within a semiconductor body having an opposite electrical conductivity type as the central well.

9. The ESD protection device of claim 8, wherein an isolation region of the first electrical conductivity type laterally and vertically separates the shallow wells from the semiconductor body and wherein the isolation region is electrically connected to the central well.

10. The ESD protection device of claim 9, wherein the central well or the isolation region touch or overlap the first and second shallow wells.

11. The ESD protection device of claim 9, wherein the isolation region comprises a buried layer having the first electrical conductivity type configured to touch the semiconductor body.

12. The ESD protection device of claim 11, wherein the central well vertically overlaps the buried layer.

13. The ESD protection device of claim 11, wherein an epitaxial layer (EPI) having the first or second electrical conductivity type is configured above the buried layer.

14. The ESD protection device of claim 9, whereby at least one contact to an interconnect to the one or more field plates is located over a central contact implant.

15. The ESD protection device of claim 9, wherein the isolation region comprises an isolation contact implant having the first electrical conductivity type.

16. The ESD protection device of claim 15, wherein at least one contact to an interconnect to a field plate is located over the isolation contact implant.

17. The ESD protection device of claim 1, wherein the one or more field plates comprise:
   a layer of dielectric material;
   a layer electrode material over the layer of gate dielectric material, wherein the layer of electrode material and the layer of dielectric material are patterned to form an opening above the central well.

18. The ESD protection device of claim 17, further comprising one or more field oxide regions comprised between the first and second shallow wells and the central well, below an edge of the one or more field plates.

19. The ESD protection device of claim 18, wherein the one or more field oxide regions comprise shallow trench isolation (STI) regions or local oxidation of silicon (LOCOS) regions.

20. The ESD protection device of claim 1, further comprising at least one additional central well having the first electrical conductivity type comprised within the central well.

21. A protecting symmetric bi-directional semiconductor ESD protection device, comprising:
   a semiconductor body having a second electrical conductivity type;
   a central shallow well comprised within the semiconductor body, wherein the central shallow well has the second electrical conductivity type;
   an central contact implant having the second electrical conductivity type comprised within the central shallow well;
   a first well and a second well comprised within the semiconductor body and substantially symmetrically spaced apart from the central shallow well, wherein the first and second wells have a first electrical conductivity type, and wherein respective wells comprise:
      a first contact implant having the first electrical conductivity type; and
      a second contact implant having the second electrical conductivity type;

one or more field plates configured above the central shallow well and laterally extending from above the central shallow well in the direct of the first or second well, wherein the one or more field plates are electrically connected to the central contact implant;

and wherein upon an ESD event at an input node comprising the first well and the first and second contact implants, a coupled npn-pnp bipolar component comprising the central shallow well, the semiconductor body, the first and second wells, and the first and second contact implants, is triggered, thereby shunting current from the first well to the second well and causing the one or more field plates to be coupled to the central shallow well.

22. The ESD protection device of claim 21, further comprising one or more field oxide regions comprised within the semiconductor body between the first and second wells and the central shallow well, below an edge of the one or more field plates.

23. A self protecting symmetric bi-directional semiconductor ESD protection device, comprising
  a central deep well of a first electrical conductivity type comprised within an epitaxial (EPI) layer over a semiconductor body, both the EPI layer and the semiconductor body having a second electrical conductivity type;
  an central contact implant having the first electrical conductivity type comprised within the central deep well;
  a first shallow well and a second shallow well comprised within the semiconductor body and substantially symmetrically spaced apart from the central deep well, wherein the first and second wells have the first electrical conductivity type and vertically extend through the EPI layer, and wherein respective shallow wells comprise:
    a first contact implant having the first electrical conductivity type; and
    a second contact implant having the second electrical conductivity type;
  one or more field plates configured above the central deep well and laterally extending from above the central deep well in the direct of the first or second shallow well, wherein the one or more field plates are electrically connected to the central contact implant;
  a buried layer having the first electrical conductivity type under the central deep well and the shallow wells, wherein the buried layer touches the central deep well and the semiconductor body and laterally extends beyond the shallow wells;
  a deep well ring configured to surround the shallow wells and to touch the central deep well, thereby forming a closed deep well ring of the first electrical conductivity type which, in combination with the buried layer, isolate the shallow wells from the EPI layer and the semiconductor body; and
  wherein upon an ESD event at an input node comprising the first shallow well and the first and second contact implants, a coupled npn-pnp bipolar component comprising the central deep well, the EPI layer, the first and second shallow wells, and the first and second contact implants, is triggered, thereby shunting current from the first well to the second well and causing the one or more field plates to be coupled to the central deep well.

24. The ESD protection device of claim 23, wherein an isolation region of the first electrical conductivity type laterally and vertically separates the shallow wells from the semiconductor body and wherein the isolation region is electrically connected to the central deep well.

25. The ESD protection device of claim 24, further comprising one or more field oxide regions comprised within the EPI layer between the first and second shallow wells and the central deep well, below an edge of the one or more field plates.

* * * * *